United States Patent [19]

Adams et al.

[11] Patent Number: 4,782,284

[45] Date of Patent: Nov. 1, 1988

[54] FREQUENCY ANALYZER

[75] Inventors: Robert W. Adams, Acton; Donald M. Boettger, Millbury, both of Mass.

[73] Assignee: BSR North America Ltd., Newton, Mass.

[21] Appl. No.: 142,940

[22] Filed: Jan. 12, 1988

[51] Int. Cl.⁴ ............................................. G01R 23/16
[52] U.S. Cl. ................................................. 324/77 B
[58] Field of Search ..................... 324/58.5 R, 58.5 A, 324/57 SS, 77 R, 77 A, 77 B, 78 R, 79 R, 73 R; 364/484, 485, 487

[56] References Cited

U.S. PATENT DOCUMENTS

| 4,578,638 | 3/1986 | Takano | 324/77 B |
| 4,607,216 | 8/1986 | Yamaguchi et al. | 324/77 B |
| 4,613,814 | 9/1986 | Penney | 324/77 B |
| 4,649,496 | 3/1987 | Anderson et al. | 364/485 |
| 4,660,150 | 4/1987 | Anderson et al. | 364/485 |
| 4,672,308 | 6/1987 | Leikus | 324/79 R |
| 4,685,065 | 8/1987 | Braun et al. | 364/485 |
| 4,703,433 | 10/1987 | Sharrit | 364/485 |

Primary Examiner—Michael J. Tokar
Attorney, Agent, or Firm—Schiller, Pandiscio & Kusmer

[57] ABSTRACT

A real time analyzer is disclosed and is adapted to determine the frequency response of a frequency dependent system based on a statistical average of the real time input and output signals of the frequency dependent system, distinguishing between "valid" and "invalid" data as those terms are predefined, so that the response can be measured with any arbitrary input signal to the frequency dependent system.

36 Claims, 4 Drawing Sheets

FREQUENCY ANALYZER

This invention relates to apparatus for measuring the frequency response of a frequency dependent system such as an acoustic environment, a recording or transmission medium, or an audio component.

In general, the spectral content of input signals provided to a frequency dependent system is usually modified as each input signal passes through the system and appears as an output signal. The manner in which the spectral content of the input signal is usually modified by the frequency dependent system is defined as the frequency response of the system. It is often desirable to measure the frequency response of a frequency dependent system in one or more predetermined frequency bands in a preselected frequency spectrum. For instance, it may be desirable to measure the frequency response over the entire audio frequency range, typically considered to be a range of frequencies from about 20 Hz to about 20,000 Hz, of a listening area such as an auditorium, or a stereo component such as an amplifier or a loudspeaker. Thus, as used herein, the term "frequency dependent system" or "FDS" shall mean any system, including an environment, apparatus, product or element, or any combination thereof, in which the spectrum of an output signal bears a relationship with the spectrum of the system input signal that is an inherent function of the system. The term "frequency dependent system" or "FDS" therefore includes (1) listening areas, such as auditoriums (where the input and output signals may be acoustic, as for example, program material provided by an orchestra or loudspeakers and heard by the listener at a particular location in the listening area); (2) records, magnetic tapes, compact discs or other recording media; (3) audio components, such as amplifiers, turntables or receivers; (4) broadcast transmitters and receivers and (5) audio processors, such as limiters, compressors, expanders, and equalizers (the input and output signals in these latter four groups being electrical). In all of the above-mentioned instances, however, the input and output signals are considered to be audio signals since they each contain information in the audio spectrum.

The frequency response of the FDS could easily be determined if the spectral content of the output response of the FDS to the input signal could be simultaneously determined with the spectral content of the input signal. The frequency response would then simply be a function of the ratio of the two spectra (output/input). But in practice there are at least two sources of time delay between the moment the input signal is applied to the input of the FDS and the moment the output response of the FDS is provided. For one, there are inherent and usually unknown time delays in many FDSs, such as, for example, the time it takes sound to propagate through air where the FDS is an auditorium. In many of these cases even if such time delays could be determined, the delays may vary over time making detection difficult if not impossible. Additional time delays may be introduced by the test and analysis equipment, which may or may not be easily compensated. The time delays become even more difficult to determine when one considers that in many FDSs, e.g., the time delay is frequency dependent.

Accordingly, prior to the present invention, the conventional wisdom has been to use a test signal having a known, uniform and constant amplitude throughout the frequency band of interest so that the amplitude of the input signal at any frequency within the spectrum of interest is time invariant and, therefore, the time delays provided by the FDS will not affect the determination of the frequency response of the FDS. The input signal can contain signal energy providing a uniform amplitude throughout a range of frequencies at any one instant of time, as in the case of pink noise (noise having equal signal energy in each octave of bandwidth of the frequency range of the entire spectrum of interest) or white noise (randomly generated noise, such as shot or thermal noise, having constant signal energy throughout the spectrum of interest, independent of the center frequency of the spectrum); or in a less efficient approach, have a uniform amplitude throughout the range of frequencies over a period of time as in the case of a sinusoidal sweep, where the frequency of a single sinusoidal signal of uniform amplitude, applied to the input of the FDS, is varied over time throughout the frequency range of interest without changing the amplitude of the input signal. When using these amplitude, time invariant input signals, the differences between the system input and output signals are independent of the time delays inherent in the FDS since the amplitude of the input signal is held at a known value over time. With a flat (known and uniform amplitude) input any deviation at the output of the FDS at any particular frequency from the uniform amplitude of the input signal should be easily detectable and provide information on the frequency response of the FDS at that particular frequency.

The problem with using amplitude time invariant input signals is that specific test signals must be generated at specific times when program information is not being transmitted through the FDS. This may not provide accurate information regarding the use of the FDS to transmit the program information. For example, it may be desirable to determine the frequency response of an auditorium filled with people during a concert. Evaluating the frequency response before the concert may provide an accurate determination of the frequency response of the auditorium when it is empty, but inaccurate when the auditorium is filled. Even determining the frequency response of a filled auditorium before a concert may be temporarily accurate, but the response may vary throughout the concert.

Accordingly, it is much more desirable to provide a "real time" analyzer capable of determining the frequency response of an FDS at any time, and in response to arbitrary input signals, such as during a concert in an auditorium.

One system that has been developed to provide real time analysis of the frequency response of an FDS, such as an auditorium, is a dual channel FFT (fast Fourier transform) analyzer. The latter includes two FFT analyzers, one for analyzing the FDS input signal and the other for simultaneously analyzing the FDS output signal. Each FFT analyzer divides the signal energy of the respective signal in each of several linear frequency bands or divisions, e.g., bands of 100 Hz each, by Fourier analysis, and provides information in each of the linear frequency bands. The two outputs of the FFTs with respect to each band are used to provide a value of the frequency response of FDS for each linear frequency band. The frequency response for each linear frequency band is combined to provide the overall frequency response of the FDS.

This dual channel, dual FFT system is, however, unsatisfactory for many reasons. For analysis purposes, divisions by linear frequency bands, such as 100 Hz divisions, is fine at the higher audio frequencies, but poor at the lower frequencies, since a great deal of information can be present in any one of the low frequency divisions. In addition such devices are relatively expensive and use "long term" averaging (each signal is typically averaged for about 15 seconds for each sample) to provide the sample values of the input and output signals of the FDS to the analyzer which do not always realistically reflect the actual values of the signals, especially since the values may include bad data, such as long term spectrally weighted noise, as for example noise provided by an audience.

In addition, since the two FFT analyzers are incapable of compensating for delays between the FDS input and output signals under test, compensation must be provided for delaying the processing of the FDS input signal with respect to the processing of the FDS output signal so that the outputs of the two FFT analyzers are processed contemporaneously with one another, i.e., the outputs of the two FFT analyzers are properly timed to provide an accurate measure of the frequency response for each linear band. For example, the FDS input signal may be deliberately time delayed by a predetermined amount so that it is properly timed with the FDS output signal as the two signals are applied to the inputs of the respective FFT analyzers. This predetermined delay, however, requires an estimate of the actual delay introduced in the FDS system between the input and output signals, which may or may not be easy to estimate. Further, it would not take into consideration variations in the time delay which might occur over time, unless the user of the system compensated for such variations.

It is a general object of the present invention therefore to provide a relatively inexpensive and compact time analyzer for quickly and accurately determining the frequency response of a FDS.

Another object of the present invention is to provide an improved real time analyzer capable of providing information in frequency divisions in a logarithmic-linear fashion so as to provide low and high frequency information with like import.

And another object of the present invention is to provide an improved real time analyzer adapted to correlate input and output signals of the FDS so as to distinguish signal information from errors resulting from signal delays and noise (such as audience noise) without the need of predetermining inherent time delays of the FDS or the testing and analyzing equipment.

These and other objects of the present invention are achieved by an improved real time analyzer adapted to determine the frequency response of a FDS based on a statistical average of the input and output signals of the FDS, distinguishing between "valid" and "invalid" data as those terms are predefined, so that the response can be measured with any arbitrary input signal to the FDS.

For a fuller understanding of the nature and objects of the present invention, reference should be had to the following drawings, wherein.

In the drawings the same numerals are used to refer to similar or identical parts.

Figure 1:
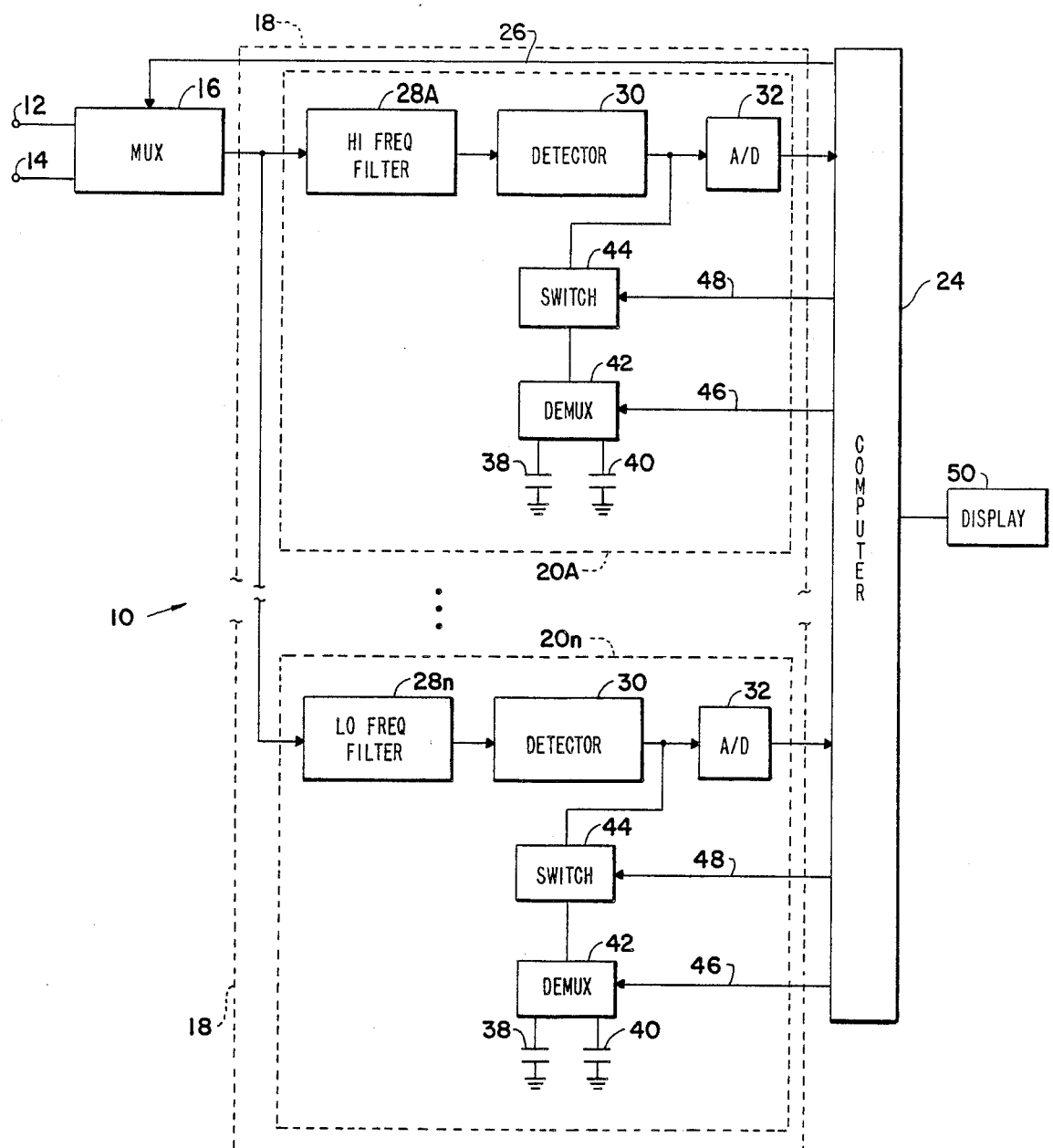
FIG. 1 is a block diagram of the preferred embodiment of the present invention.

Referring to FIG. 1, the spectrum analyzer system 10 comprises a pair of input terminals 12 and 14 for respectively receiving the input and output audio signals of the FDS. As previously described, the frequency dependent system can be any system including a listening environment, such as a concert hall. In determining the frequency response at a particular location of a concert hall, the FDS input signal is a signal representative of the program source (which for purposes of explanation will also be called the "reference" signal), e.g., the music produced by an orchestra, and may for example, be sensed by a microphone positioned at a preselected location and electrically transmitted to a mixing console. Since the frequency response can vary throughout a concert hall, the output signal of the FDS (which for purposes of explanation will also be called the "unknown" signal) will be the acoustic signal at the particular audience location at which the frequency response is to be determined, and may also be sensed by a microphone and electrically transmitted to the console. The FDS input and output signals are thus provided at the console where they can be applied to the input terminals 12 and 14 of the system 10.

The preferred system 10 is adapted to alternately sample the FDS input and output signals provided at the terminals 12 and 14 in each of a plurality of frequency bands, and statistically compare the two signals in each band so as to correlate valid data occurring in each band.

Accordingly, the system 10 also comprises (a) switching means, preferably in the form of multiplexer 16, (b) a single spectrum divider 18 including a plurality of signal detector assemblies 20 (only two of which are shown at 20A and 20n for convenience of illustration and clarity of description), and (c) a computer 24, coupled to the multiplexer 16 and each of the assemblies 20, for controlling the operation of the multiplexer 16 and each of the assemblies 20 and for determining the frequency response of the FDS coupled to the input terminals 12 and 14 of the system 10.

Multiplexer 16 is connected to alternatively provide the FDS input and output signals at the input terminals 12 and 14 to the input of each of the assemblies 20 at a predetermined sampling or multiplexing rate. As shown, input terminals 12 and 14 are connected to the respective data inputs of multiplexer 16. Computer 24 is connected by line 26 to the address input of multiplexer 16 for controlling which of the signal inputs of the multiplexer 16 is connected to the output of the multiplexer, in a well known manner. In particular, the multiplexer conducts the signal provided from either the terminal 12 or terminal 14 to its output, depending upon the state of the address signal on line 26. The output of multiplexer 16 is connected to the input of each assembly 20.

The single spectrum divider 18 is constructed to divide the spectrum of interest, e.g., the audio spectrum, into a plurality of discrete frequency bands, with each assembly 20 passing the signal energy in a unique band. Preferably, the assemblies 20 are constructed to pass substantially all of the signal energy present in the audio spectrum, although it should be appreciated that not all applications may require all of the signal energy to be passed.

Preferably, each assembly 20 includes a band pass filter 28 constructed to pass the signal energy of the corresponding desired frequency band. In the preferred embodiment each filter 28 passes substantially all the signal energy in a one-third octave band having very sharp roll-offs so that 31 assemblies are used to pass signal energy in the 20 Hz to 20 KHz audio range, with the filter 28A of the first assembly 20A passing the signal energy in the highest frequency band of 17.8 to 22.4 KHz, and the filter 28n of the last assembly 20n passing the signal energy in the lowest frequency band of 17.8 to 22.4 Hz. Although the number of assemblies 20 and the respective number of filters 28 can vary, with the corresponding pass bandwidth of each of the filters 20 varying, the more narrow the bandwidth of the filters, the more accurate the frequency response measurements will be. However, narrowing the pass bandwidth of the filters will increase the corresponding number of assemblies 20 required, and therefore increase the cost of the system 10. The one-third octave bandwidth of each filter and the corresponding number of filters required (i.e., 31) appears to be the preferred size at an affordable cost.

The output of each filter 28 is applied to the input of a respective signal level detector 30, associated with each assembly. Each detector 30 provides a signal representative of the signal energy passed by the corresponding filter 28 and applied to the input of the detector. Each detector can be any type of device for measuring the amplitude of the signal detected. For example, each detector can be an average, peak or RMS detector, which respectively provide output signals representative of the average, instantaneous peak or the instantaneous RMS energy detected at its input. Preferably, each detector is an RMS detector of the type described in U.S. Pat. No. 3,681,618, issued to David E. Blackmer.

Preferably, means, coupled to the output of each detector 30, are provided for separately storing (1) the output of the detector when the multiplexer couples input terminal 12 to the corresponding filter 28 and samples the FDS input signal, and (2) the output of the detector when the multiplexer couples input terminal 14 to the corresponding filter 28 and samples the FDS output signal. The latter means preferably includes a pair of capacitors 38 and 40 for storing the average values of the respective signals provided from the detector. The capacitors 38 and 40 replace the output capacitor normally used in each signal level detector of the type previously described. A separate capacitor for storing the values of the input and output signals is preferred due to the nature of the detectors. More specifically, the settling times of the RMS detectors of the type described tend to be relatively slow, particularly at lower audio frequencies. The reason for the slow settling time is primarily due to the output capacitor of the detector. The capacitor is typically of a value that usually takes a predetermined amount of time to settle in response to the input signal to the detector. As a consequence, if the multiplexer 16 were allowed to operate at a multiplexing or sampling rate which is faster than the settling time of the corresponding detectors 30, the detectors will not provide accurate output signals making measurements of the frequency response difficult, if not impossible. If the multiplexing rate is slowed down to accommodate the required settling time of the detector, the slower rate at which the FDS input and output signals are sampled would be less accurate since these signals vary over time. By using separate capacitors 38 and 40 for the FDS input and output signals respectively, each capacitor will store the previous level of the output of the detector with respect to the respective signal sensed at the terminal 12 and 14, so that less settling time will usually be required when the capacitor is connected for the next sampling period the same terminal is connected through the multiplexer.

Preferably, the control of the signal detectors as they are applied to the respective capacitors 38 and 40 is accomplished with the demultiplexer 42 and switch 44. Specifically, demultiplexer 42 has its data input connected through switch 44 to the output of detector 30 and its two data outputs respectively connected to a plate of the capacitors 38 and 40, each of which in turn has its other plate connected to system ground. The demultiplexer has an address input connected by line 46 to computer 24. The demultiplexer alternately couples either capacitor 38 or capacitor 40 with the output of signal level detector 30 (when the switch 44 is closed as described below) in response to an address or control signal provided by computer 24 over line 46.

Switch 44 is an inhibit switch, inhibiting the connection between the output of detector 30 and the capacitors 38 and 40 following the initial switching by the multiplexer and demultiplexer long enough so that any ringing which occurs in the filter 34 from the switching will not have a substantial effect on the signal applied to either capacitor. One contact of the switch is connected to the output of the respective signal level detector 30, while the other contact of the switch is connected to the data input of the demultiplexer 42. The switch 44 is preferably controlled by an on/off signal and an inhibit signal provided over lines 48 from computer 24.

Demultiplexer 42 and switch 44 may each be conventional parts. Preferably, however, both are provided in the combined form of a pair of CMOS switches (one for each capacitor 38 and 40) having an on, off and inhibit state and connected to operate in a mutually exclusive manner so that only one CMOS switch can be closed at any one time (so as to connect the corresponding capacitor 38 or 40 to the output of the signal level detector 30), although both can be open and/or inhibited at the same time.

The output of each detector 30 is connected through an analog-to-digital (A/D) converter 32 to a data input of computer 24 so that the cumulative signal output of the detector, stored on either the capacitor 38 and 40, is provided to the computer. Alternatively, the outputs of all the detectors 30 may be connected to a multiplexer (not shown) which is controlled by computer 24 so as to select any one of the detector outputs and apply the selected signal to a single A/D converter 32 so that the computer can sequentially read the values of the detectors.

Computer 24 comprises a conventional microprocessor chip, such as the 8088, manufactured for example by Intel of Santa Clara, Calif., and includes suitable memory for storing the information required. As described in more detail below, computer 24 provides control signal information over line 26 to multiplexer 16, over line 46 to demultiplexer 42 and over lines 48 to switch 44 for controlling which of the two information signals applied to the input terminals 12 and 14 are transmitted through the system 10 and added to the signal value stored on capacitors 38 and 40, which capacitor is connected to the A/D converter 32, and when the switch 44 is off, on and in its inhibit state. Computer 24 also includes suitable graphics hardware in the form of display 50, which includes, for example, a CRT monitor or printer for displaying the output of the computer 24.

In accordance wit the principles of the present invention, computer 24 also compares the differences between the signal energy of the FDS input signal provided at input terminal 12 and stored on capacitor 38 with the signal energy of the FDS output signal provided at input terminal 14 and stored on capacitor 40 in each of the frequency bands defined by the filters 28, in accordance with statistical and analytical techniques described hereinafter with respect to the description of FIG. 4. Preferably, the computer is programmed so as to run in accordance with the routine and subroutine respectively shown in FIGS. 3 and 4, described hereinafter.

Figure 2:
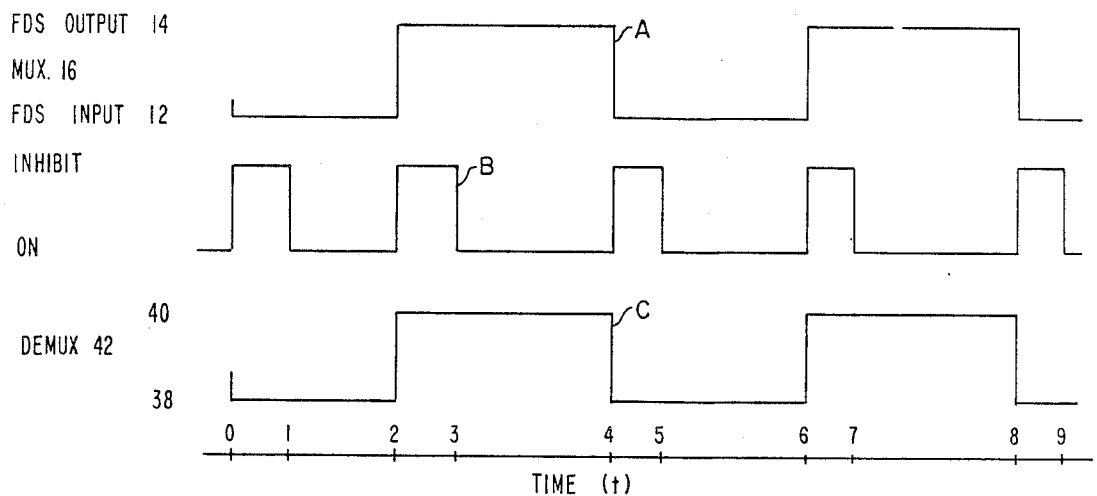
FIG. 2 is a timing diagram illustrating the operation of various elements of the preferred embodiment shown in FIG. 1.
Figure 3:
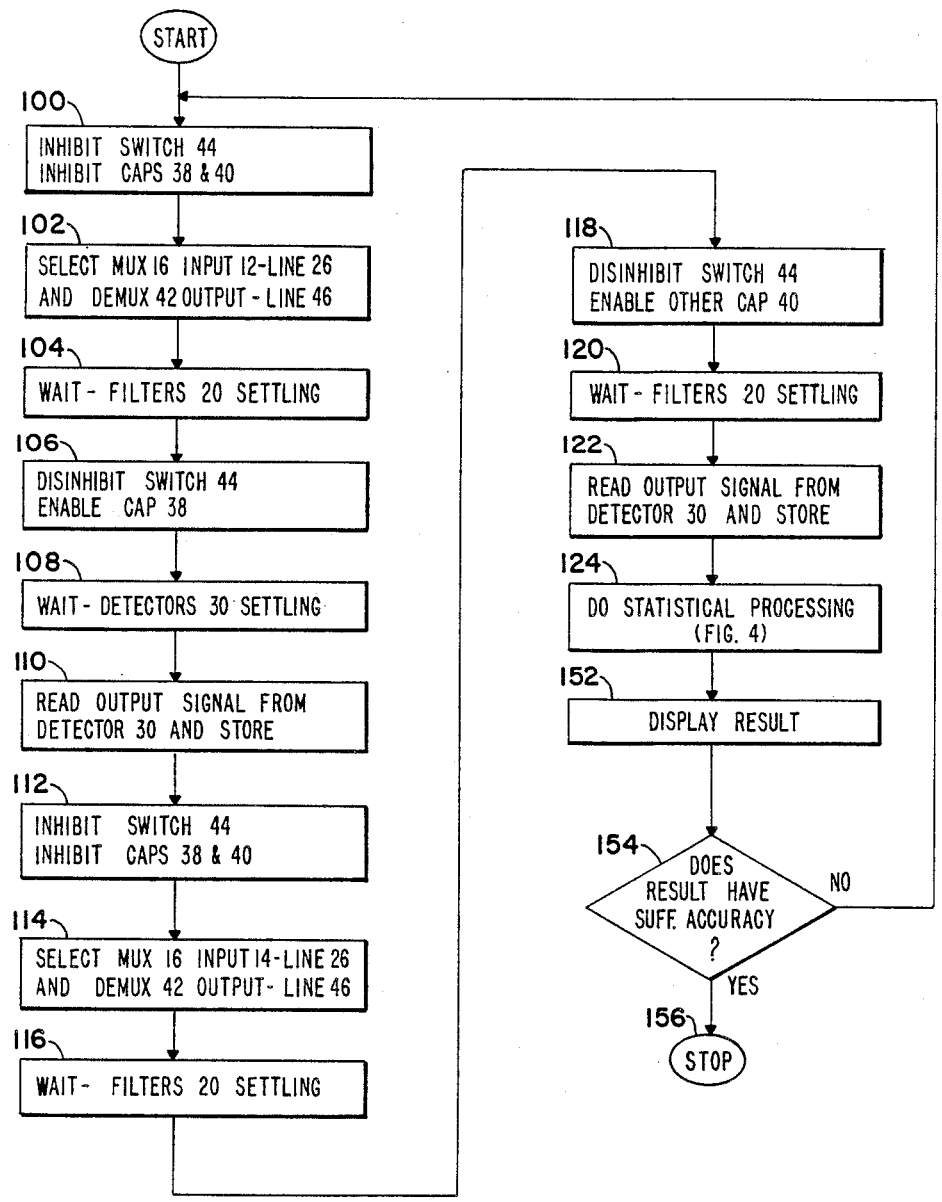
FIG. 3 is a flow chart of the various steps of the routine performed by the computer, used in the FIG. 1 embodiment to control the operation of the system shown.
Figure 4:
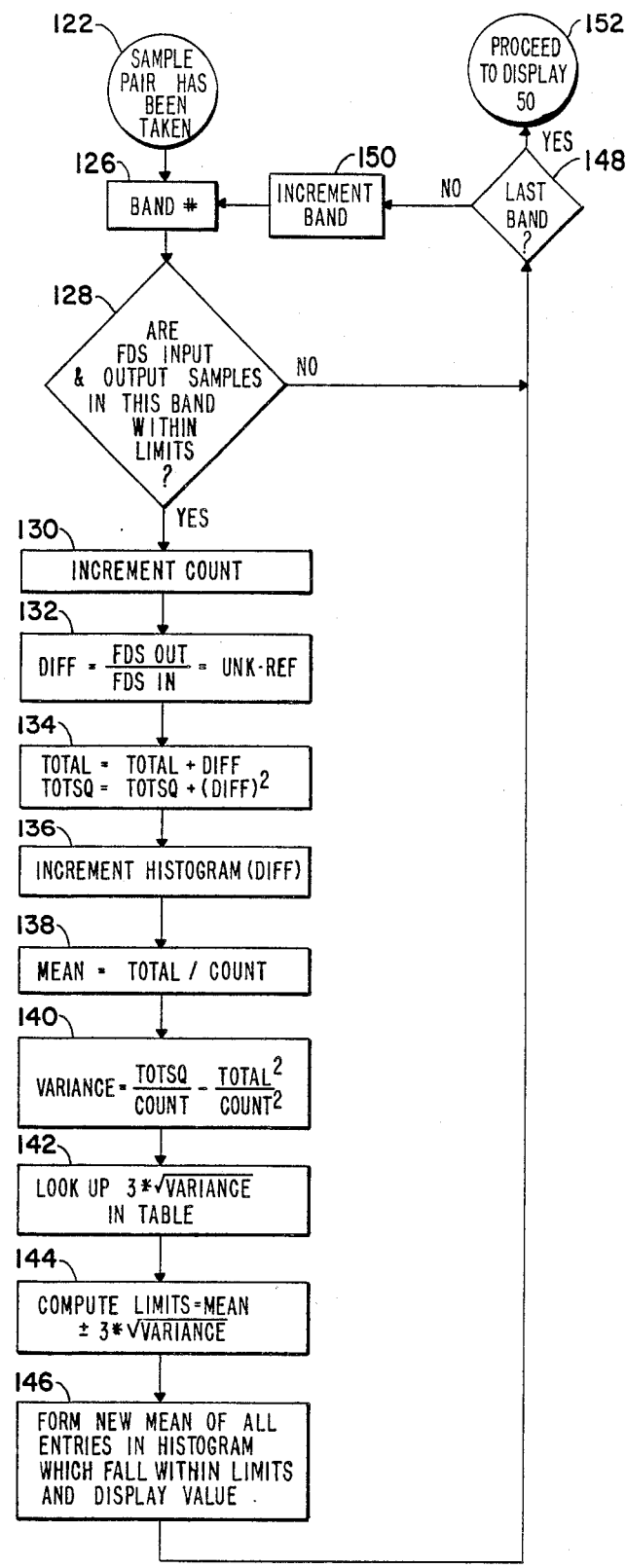
FIG. 4 is a flow chart of the various steps of a subroutine of the routine shown in FIG. 3.

In operation, referring to FIGS. 2–4, input terminal 12 of system 10 is connected to receive the FDS input information signal and input terminal 14 of system 10 is connected to receive the FDS output information signal.

Once connected, the computer 24 can process the signal information of the FDS input and output signals according to the steps set forth in the flow charts shown in FIGS. 3 and 4. The computer 24 of the preferred embodiment is designed to operate the multiplexer 16 and each of the demultiplexers 42 simultaneously at the same repetition rate so that when input terminal 12 is connected to the output of multiplexer 16, the input of the demultiplexer 42 is connected to the capacitor 38, and when the input terminal 14 is connected to the output of multiplexer 16, the input of demultiplexer 42 is connected to the capacitor 40.

For ease of exposition the control of only one detector assembly 20 is described hereinafter. It should be appreciated, however, that all of the assemblies 20 of the preferred embodiment are substantially identically controlled by computer 24.

The computer begins at step 100, depicted in the flow chart of FIG. 3, at time $t=0$ (shown in FIG. 2) by inhibiting switch 44 (through line 48) so that no signal is provided to either capacitor 38 or 40. Referring in FIG. 2 to the timing diagram, as shown by the graph B, the inhibit pulse is not provided until time $t=1$. At approximately $t=0$, the computer proceeds to step 102 of FIG. 3 and provides an address signal (shown as graph A in FIG. 2) over line 26 so that the input terminal 12 is connected through the multiplexer 16 to the output of the latter. In addition, a signal (shown as graph C in FIG. 2) is provided over address line 46 to the demultiplexer 42 so that the data input of the demultiplexer is connected to the capacitor 38. The filter 28 is allowed sufficient time to settle, i.e., until time $t=1$, as indicated at step 104 in FIG. 3. At time $t=1$, when the filter 28 has had sufficient time to settle, step 106 occurs wherein the inhibit pulse, applied to the switch 44, is removed so that the switch is closed between the output of the detector 30 and the capacitor 38. At $t=1$, the output of detector 30 is applied to the capacitor 38, where the signal output is stored. As indicated at step 108 of FIG. 3, following the closing of switch 44 and the removal of the inhibition pulse, sufficient time is allowed for the detector 30, and in particular the capacitor 38, to settle in response to the signal at the output of the detector so that sometime between $t=1$ and $t=2$, the computer 24 is enabled to receive the output of the detector 30 through the analog to digital converter 32, and store it in memory as indicated at step 110.

At step 112 of FIG. 3, at time $t=2$ of FIG. 2, the computer input from the A/D converter 32 becomes disabled, and switch 44 is again inhibited by the pulse on line 48 and shown at B in FIG. 2 between $t=2$ and $t=3$ so as to prevent the input of the demultiplexer 42 from being connected to the output of the detector 30 (see step 112 of FIG. 3). At this time, $t=2$, the computer changes the address signals provided over lines 26 and 46, respectively to the multiplexer 16 and demultiplexer 42. Thus, the input terminal 14 is connected to the output of the multiplexer 16 and the data input of the demultiplexer 42 is connected to the capacitor 40 as indicated at step 114 of FIG. 3. Again the switch 44 is inhibited long enough for the filter 28 to settle (see step 116 of FIG. 3), i.e., until time $t=3$ of FIG. 2. At $t=3$ the inhibit pulse provided on one of the lines 48 is removed (step 118 of FIG. 3). The detector 30 is then allowed to settle, i.e., the capacitor 40 is allowed to settle in response to the signal output of the detector (step 120 of FIG. 3).

Once the detector settles, the computer is enabled, during the time interval between $t=3$ and $t=4$, to read and store the output signal of the detector on the capacitor 40, applied through the A/D converter 32 to the input of the computer (step 122 of FIG. 3). The two values read into and stored in the computer represent the samples of the amount of signal energy in the frequency band defined by the pass band of filter 34 in the two signals applied to the input terminals 26 and 28 during the measurement intervals. Preferably, the measured value of signal energy on each capacitor is the rms value of the corresponding signal averaged over the sampling interval. The computer can then proceed with its statistical analysis (step 124).

The preferred statistical analysis performed by the system 10 at step 124, will be described in connection with the subroutine as depicted by the flow chart shown in FIG. 4. All variables, except the value of "band", are memory arrays with entries for each band, and at the beginning of the process, all variables are set to zero. As shown when the sample pair is taken for the band indicated (i.e., the assembly 20 from which the two samples are taken), the band number will be indicated (in the preferred embodiment the 31 bands are numbered from 0 to 30) as indicated at step 126. The process can start with any band since the routine of FIGS. 3 and 4 continually repeats.

The two sample values (amplitudes) are then each compared to maximum and minimum amplitude limits at step 128 of FIG. 4. The limits are symmetrically set about some arbitrary value in the midrange of values of the range of expected values. The lower limit is set to prevent sampling when no information is present, only noise (so that the lower limit is set above the noise floor). The upper limit is set to prevent clipping of the sample values since the system can only handle so much signal energy. Also by setting a lower and upper limit, large changes in gain (the ratio of the value representative of the FDS output signal to the value of the FDS input signal) can be detected and rejected, as for example when there is a change in the setting of the FDS under test, or a microphone or system component fails.

Should the value of either sample fall outside the limits set, the program will proceed to step 148, described hereinafter. If, however, both values are within the limits set, the program proceeds to step 130. At step 130, the system increments the count of acceptable values for the band indicated at step 126, i.e., the total number of sample values that are both within the window defined by the upper and lower limits at step 126 during the test.

The subroutine next performs step 132 by computing the value of the ratio of the last sample representative of the FDS output signal to the value of the last sample representative of the FDS input signal. Since the two values are taken from the output of the RMS detector 30, the values taken will be related as a logarithmic function of the FDS input and output signals so that the actual ratio, indicated as DIFF can be provided by subtracting the value of REF (the value of the output of the detector 30 representative of the FDS input signal) from the value of UNK (the value of the output of the detector 30 representative of the FDS output signal).

Once the DIFF value has been computed, the subroutine proceeds to step 134 where the value is added to the accumulated values (i.e., running sums) of DIFF, "TOTAL" (stored in memory array), for the band under test, by adding the last value of DIFF to TOTAL. In addition the accumulated values of the square of TOTAL, "TOTSQ", are stored in a memory array, and the square of the new value of DIFF is squared, (as represented by $(DIFF)^2$) and added to TOTSQ.

At step 136 the value of DIFF is stored at the appropriate location of the values kept for a histogram for the band indicated step 126. More specifically, since DIFF is a digital value and thus the total number of possible values between the upper and lower limits set at step 128 is finite, a histogram of the data for the FDS input and output signals at each band is easily kept by counting the number of times each value of DIFF is stored during the sampling intervals. With each added value of DIFF to the histogram, a distribution of values will eventually be provided which is a substantially Gaussian distribution about the mean. For example, if the resolution of DIFF is 1 dB, i.e., the values are determined in 1 dB increments, between limits of +20 dB and −20 dB the histogram will contain 41 different possible values. Each time the value of DIFF is +1 dB, the histogram value of +1 dB is incremented by one.

The value of the mean is next computed at step 138 by dividing the value of TOTAL (provided at step 134) by the value of COUNT (provided at step 130). In addition the current value of the VARIANCE, defined as the cumulative valve of TOTSQ/COUNT minus the cumulative value of $(TOTAL)^2/(COUNT)$ is computed. Once the current value of the VARIANCE is determined the subroutine proceeds to step 140.

At step 140 the value of three times the standard deviation is determined by determining the value of 3 times the square root of the value of VARIANCE. The value of the latter is determined by using a standard deviation lookup table which has been stored in memory in computer 24.

At step 142 the value of 3 times the standard deviation is then used to set the limits of valid data in the histogram. In other words data in the histogram between the predetermined limits is treated as valid data, while data outside the limits is rejected as invalid. For example, if the mean is determined to be +2 dB and the value of three times the standard deviation were determined to be plus and minus 10 dB, the limits are set at −8 dB and +12 dB. In such a case all values in the histogram falling below −8 dB and above +12 dB are rejected as invalid, while all values of the histogram inbetween or at these limits are accepted as valid data.

At step 146, a new value of the mean is determined (for display purposes only, without affecting the values determined at steps 130-138) by deleting the number of counts representative of the values falling outside the limits (subtracted from the value of COUNT) and deducting the accumulated value of the rejected values in the histogram falling outside the limits (subtracted from the current value of the TOTAL). The remaining value of TOTAL is then divided by the remaining value of COUNT.

The subroutine proceeds to step 148 to determine whether the band number set at step 126 is the last band, i.e., the 31st band. If not the subroutine proceeds to step 150 to increment the band number at step 126, whereupon the subroutine repeats steps 128 through 148, or steps 126, 128, 148 and 150 depending upon whether the samples are accepted or rejected at step 128. The program maintains these alternative loops until the last band is tested at step 148, whereupon the program proceeds to step 152 of the main routine of FIG. 3.

The computed values for all of the assemblies 20 are then provided for a complete measurement cycle of the device. These values can then be displayed on display 50 in any form such as graphics or as numerical values. Step 152 ends a measurement cycle of the system 10.

The computer then makes a determination whether the results have sufficient accuracy (step 154 in FIG. 3). This is accomplished by comparing the computed value of the mean for each frequency band determined in the last run of the of subroutine of FIG. 4 with the corresponding value from the last measurement cycle. Should the values for all of the frequency bands be substantially identical then the result has sufficient accuracy and the routine of FIG. 3 proceeds to step 156 and stops. Should the values for any one frequency band differ the routine proceeds to step 100 and repeats the routine.

The measurement cycle is repeated wherein system 10 repeats steps 100 through 154, including the continuous loop subroutine shown in FIG. 4. The system will keep repeating steps 100 through 154, until the conditions at step 154 are met. Eventually the values provided for the frequency band will stabilize giving accurate values of the frequency response in each frequency band and the system will proceed to step 156.

The specific amount of time between the various time intervals will vary depending upon the signal detector assemblies 20, and in particular the settling times of the filters 28 and signal level detectors 30 employed in the assembly. However, because a different capacitor 38 and 40 is used to respectively store values corresponding to the signal energy of the signals provided at the input terminals 12 and 14 accumulated over time, the amount of time between successive sampling intervals (for example, the time between t=4 when one such sampling interval is completed and the t=8 when the next such sampling interval commences) can be greatly reduced, from the time that would be required had a single capacitor been used to measure the signal energy in the frequency band from both input terminals.

This reduction in time occurs because the value of the signal stored on each capacitor 38 and 40 is required to change from the last measured signal value at the corresponding terminal and the next measured signal value at that terminal, which typically should not vary appreciably, rather than from the value at the other terminal, which may be significantly different. The slowest settling times occur at the lowest frequencies.

By way of comparison, therefore, assembly 20n, where the filter provides the lowest audio frequency pass band, requires the longest settling time, which can be accommodated by multiplexing and demultiplexing (sampling) rates (between time t=0 and t=4 and between time t=4 and t=8) of about 1.0 second, which is substantially shorter than the required settling time, of about 10 seconds required if one capacitor were used to function for both signal inputs at input terminals 12 and 14. Further, the length of time of the inhibition pulse for inhibiting the switch 44, between t=0 and t=1, t=2 and t=3, t=4 and t=5, etc. is sufficient to allow the filters to ring when the multiplexer switches from one input to the other. The ringing time is longer at lower frequencies, with the filter providing the lowest frequency pass band providing ringing for about 0.5 seconds, although the pulse width of each inhibition pulse is set to about 0.3333 seconds since any ringing in any of the filters thereafter is not significant. Thus, by way of example the multiplexer 16 is multiplexed and the demultiplexers 42 can be demultiplexed at a sampling rate of about 1.0 seconds, while the inhibition pulse is set at a width of about 0.3333 seconds.

It should be appreciated that various changes can be made to system 10 without departing from the scope of the present invention. For example since the settling time of the filters decreases with increasing frequency of the bandpass region of the filter, the timing of the cycle of the alternating multiplexing operation can vary as a function of the frequencies passed by the corresponding filter 28 of the assembly 20. Accordingly, if desired a separate multiplexer 16 can be used with each assembly 20 and the multiplexing rate of each multiplexer can be set as a function of the settling time of the corresponding filter 28 of the assembly, with the rate of sampling being faster at the higher frequencies than the lower frequencies.

Further, where one of several components of the frequency dependent system is being analyzed, such as for example where the frequency response of a recording medium is being tested on a playback device, the frequency response of the remaining components (such as the playback device) can be predetermined, stored in computer 24 and cancelled during the analysis of the frequency response of the component of interest.

Figure 5:
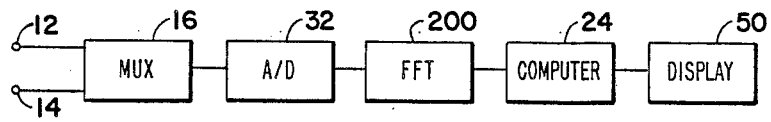
FIG. 5 is a block diagram of an alternative embodiment of the present invention.

In addition, the spectral content of each of the FDS input and output signals can be sensed by other means besides the single spectrum divider 18, which includes the bank of filters 28, and more generally the assemblies 20. As shown in FIG. 5 a fast Fourier transform device (FFT) 200 can be used to provide information representative of the spectral content of each of the FDS input and output signals within predetermined sampling periods.

More specifically, as shown in FIG. 5, multiplexer 16 is used to alternately sense the FDS input and output signals at terminals 12 and 14 at a predetermined multiplexing rate so that a portion of the FDS input signal, and a portion of the FDS output signal are successively provided to the output of the multiplexer during successive multiplexing intervals. The output of the multiplexer 16 is applied to the input of the A/D converter 32. The output of the latter is applied to the input of an FFT 200, which in turn provides its output signal to and is controlled (in a well known manner) by computer 24. The output of computer 24 is applied to the display 50. As is well known the FFT device 200 takes a string of input samples from the A/D converter 32, provided during the multiplexing interval when either the input 12 or the input 14 is connected to the output of the multiplexer, and operates on a block of such samples to generate a signal output in the form of a set of digital signals representative of the spectral content of the each portion of signal represented by the block of samples. Typically, an FFT device takes a large number of samples, e.g., 1024, for each set of digital signals generated, although the exact number per block can vary. Since the output of the FFT device is linear with frequency, not logarithmically spaced as provided in the embodiment of FIG. 1, the computer 24 is preferably adapted to combine the groups of high frequency data points to produce the logarithm spacing typically used in analysis of audio FDS systems. Computer 24 analyzes the data in the same manner as previously described with respect to FIGS. 3 and 4.

In operation the multiplexing rate of the multiplexer 16 shown in FIG. 5 is sufficiently slow so that a sufficient amount of signal is applied to the A/D converter 32 during each multiplexing interval when a portion of either the FDS input or output signals are provided to the input of the A/D converter 32, while the sampling rate of the A/D converter 24 is sufficiently fast so that during each such multiplexing interval a sufficient number of samples are provided to the FFT, e.g., 1024.

The system 10 possesses significant cost and space requirement benefits by using a single spectrum divider 18, comprising the assemblies 20 or the fast Fourier transform device 200, to analyze both the input and output signals of the frequency dependent system under test. The single spectrum divider is made possible by the statistical analysis approach. By using two capacitors 38 and 40 to store the output of each signal level detector and the multiplexer 16 and demultiplexer 42 arrangement, a faster system is provided without sacrificing accuracy. Further, the problem of settling times of the filter and detector is greatly reduced by using the two capacitors, the multiplexer 16 and demultiplexer 42 for each assembly 20 and the inhibition switch 44. Since each capacitor stores the accumulated or average value of the output of the detector in response to the respective input signal at input terminal 12 and 28, less settling time is required. Since less settling time is required, the sampling rates can be increased, providing more accurate readings in a shorter period of time.

Because certain changes may be made in the above apparatus without departing from the scope of the invention herein involved, it is intended that all matter contained in the above description or shown in the accompanying drawing shall be interpreted in an illustrative and not in a limiting sense.

What is claimed is:

1. Apparatus for determining the frequency response, within at least one frequency band, of a frequency dependent system defined by a system input for receiving a system input signal and a system output for providing a system output signal in response to the system input signal, said apparatus comprising:
    a first signal path for receiving and transmitting said system input signal;
    a second signal path for receiving and transmitting said system output signal;

signal processing means, including an input and an output, for providing a signal output representative of the signal energy within said frequency band of each of said system input and output signals;

switching means, having a pair of inputs respectively coupled to said signal paths and an output coupled to the input of said signal processing means, for alternatively coupling said first and second signal paths to the input of said signal processing means at a predetermined sampling rate so that said signal processing means provides, at alternating sampling periods of a predetermined length, a first signal representative of the signal energy of said system input signal within said frequency band during each of the sampling periods said first signal path is coupled to the input of said signal processing means, and a second signal representative of the signal energy of said system output signal within said frequency band during each of the sampling periods said second signal path is coupled to the input of said signal processing means; and signal analyzing means, coupled to the output of said signal processing means, for determining said frequency response as a function of said first and second signals.

2. Apparatus according to claim 1, wherein said signal processing means includes means for generating said first and second signals respectively as functions of the average signal energy of said input and output signals in said frequency band during the sampling periods the first and second signal paths are respectively coupled to the input of said signal processing means.

3. Apparatus according to claim 2, wherein means for generating said first and second signals includes an RMS detector.

4. Apparatus according to claim 2, wherein said means for generating said first and second signals includes (a) first and second signal storage means for respectively storing said first and second signals during said sampling periods, and (b) second switching means, including an input coupled to the output of said first switching means and two outputs respectively coupled to said first and second signal storage means, for alternatively coupling the output of said first switching means to the first and second storage means at said sampling rate so that said second switching means provides, at alternating sampling periods of a second predetermined length, said first signal to said first storage means during each of the sampling periods said first signal path is coupled to the input of said signal processing means, and said second signal to said second storage means during each of the sampling periods said second signal path is coupled to the input of said signal processing means.

5. Apparatus according to claim 4, wherein said first and second signal storage means each includes a capacitor.

6. Apparatus according to claim 4, wherein said means for generating said first and second signals includes means for inhibiting said second switching means before each of said sampling periods of said second predetermined length.

7. Apparatus according to claim 1, wherein said signal analyzing means includes means for determining the measured difference between said output signal and said input signal as a function of the difference between said first and second signals for each successive pair of sampling intervals.

8. Apparatus according to claim 7, wherein said signal analyzing means includes means for determining the average of the measured differences between said output signal and said input signal as a function of the differences between said first and second signals for successive pairs of sampling intervals.

9. Apparatus according to claim 8, wherein said means for determining the average of the measured differences includes means for rejecting those measured differences above a first predetermined reference value and below a second predetermined reference value.

10. Apparatus according to claim 9, wherein said means for determining the average of the measured differences includes means for rejecting those measured differences exceeding a predetermined standard deviation about the norm of the measured differences.

11. Apparatus according to claim 1, wherein said signal processing means includes a fast Fourier transform device.

12. Apparatus according to claim 1, wherein (a) said apparatus determines the frequency response of said frequency dependent system within each of a plurality of frequency bands, (b) said signal processing means includes spectrum divider means for detecting the signal energy of said system input and output signals during said sampling periods within each of a plurality of passbands respectively defining said plurality of said frequency bands such that (i) said first signal includes a first plurality of signal components representative of the corresponding signal energy of said system input signal within the respective frequency bands during each of the sampling periods said first signal path is coupled to the input of said signal processing means, and (ii) said second signal includes a second plurality of signal components representative of the corresponding signal energy of said system output signal within the respective frequency bands during each of the sampling periods said second signal path is coupled to the input of said signal processing means, and (c) said signal analyzing means determines said frequency response in each of said bands as a function of said first and second pluralities of components.

13. Apparatus according to claim 12, wherein said spectrum divider means includes a plurality of filters having passbands for respectively defining said frequency bands.

14. Apparatus according to claim 12, wherein said signal processing means includes means for generating said first and second plurality of signal components respectively as functions of the average signal energy of said input and output signals in the corresponding frequency bands during the sampling periods the first and second signal paths are coupled to the input of said signal processing means.

15. Apparatus according to claim 14, wherein means for generating said first and second plurality of signal components includes a like plurality of RMS detectors.

16. Apparatus according to claim 14, wherein said means for generating said first and second plurality of signal components includes (a) first and second signal storage means for respectively storing said each of said plurality of said first and second signal components during said sampling periods, and (b) second switching means, including an input coupled to the output of said first switching means and two outputs respectively coupled to said first and second signal storage means, for alternatively coupling the output of said first switching means to the first and second storage means at said sampling rate so that said second switching means provides, at alternating sampling periods of a second predetermined length, each of said first plurality of signal components to said first storage means during each of the sampling periods said first signal path is coupled to the input of said signal processing means, and each of said second plurality of signal components to said second storage means during each of the sampling periods said second signal path is coupled to the input of said signal processing means.

17. Apparatus according to claim 16, wherein said first and second signal storage means each includes a capacitor for storing each of said components.

18. Apparatus according to claim 16, wherein said spectrum divider means includes a plurality of filters having passbands for respectively defining said frequency bands.

19. Apparatus according to claim 18, wherein said means for generating said first and second signals includes means for inhibiting said second switching means before each of said sampling periods of said second predetermined length so as to allow said filters to ring following the commencement of each of said sampling periods of said first predetermined length.

20. Apparatus according to claim 12, wherein said signal analyzing means includes means for determining the measured difference between the signal energy of said output signal in each of said frequency bands and the respective signal energy of said input signal in each of said frequency bands as a function of the difference between said first plurality of signal components and the corresponding second plurality of signal components for each successive pair of sampling intervals.

21. Apparatus according to claim 20, wherein said signal analyzing means includes means for determining the average of the measured differences between said components of said output signal and the corresponding components of said input signal as a function of the differences between said first plurality of signal components and the corresponding second plurality of signal components for successive pairs of sampling intervals.

22. Apparatus according to claim 21, wherein said means for determining the average of the measured differences includes means for rejecting those measured differences above a first predetermined reference value and below a second predetermined reference value.

23. Apparatus according to claim 22, wherein said means for determining the average of the measured differences includes means for rejecting those measured differences exceeding a predetermined standard deviation about the norm of the measured differences.

24. Apparatus for determining the frequency response, within at least one spectral band and in accordance with a predetermined analytical function, of a frequency dependent system defined by a system input for receiving an input signal and a system output for providing an output signal, said apparatus comprising:

first apparatus input means for receiving said input signal;

second apparatus input means for receiving said output signal; and multiplexer means for providing a multiplexer output signal alternately corresponding to one of at least two multiplexer input signals in response to a first control signal and at a predetermined repetition rate so as to provide alternating sampling intervals, said multiplexer means comprising (a) first and second multiplexer inputs, coupled to the corresponding first and second apparatus input means, for receiving said first and second multiplexer input signals respectively as a function of said input and output signals, and (b) a multiplexer output for providing said multiplexer output signal (i) substantially equal to said first multiplxer input signal when said first control signal is of a first state, and (ii) substantially equal to said second multiplexer input signal when said first control signal is of a second state;

detector means, including a detector input coupled to said multiplexer output and a detector output, for providing a detector output signal at said detector output as a function of the signal energy in said multiplexer output signal within said one spectral band;

demultiplexer means for alternatively providing one of at least two demultiplexer output signals substantially equal to a demultiplexer input signal in response to a second control signal and at said predetermined repetition rate synchronized with said multiplexer means, said demultiplexer means comprising (a) a demultiplexer input coupled to the detector output for receiving said demultiplexer input signal as a function of said detector output signal and (b) at least two demultiplexer outputs for selectively and respectively providing one of said demultiplexer output signals when said second control signal is of a first state and the other of said demultiplexer output signals when said second control signal is of a second state, wherein said demultiplexer output signals are respectively a function of the signal energy within said spectral band of said first and second multiplexer input signals depending on the state of said first control signal; and first and second signal storage means, respectively coupled to said demultiplexer outputs, for respectively storing each of said demultiplexer output signals; and computer means, coupled to said multiplexer means, demultiplexer means and each of said signal storage means, for (a) generating said first and second control signals so that said first and second demultiplexer output signals stored in said signal storage means are a function and representation of the signal energy in said one spectral frequency band of said input and output signals, respectively and (b) analyzing said first and second demultiplexer output signals in said signal storage means in accordance with said predetermined analytical function so as to determine said frequency response.

25. Apparatus according to claim 24, wherein said computer means generates said first control signal so as to alternately couple at said predetermined repetition rate said first and second apparatus input means to said multiplexer output and to alternately couple at said predetermined repetition rate said detector output to said first and second storage means.

26. Apparatus according to claim 24, wherein said detector means generates said detector output as a function of the rms value of the amplitude of the multiplexor output during each of said sampling intervals.

27. Apparatus according to claim 24, wherein said assembly further includes a filter, coupled to the multiplexer output, for transmitting the signal energy of the multiplexer output only within said spectral band.

28. Apparatus according to claim 27, further comprising switching means, connected between said detector output and said first and second storage means and responsive to a third control signal generated by said computer means, for selectively initially inhibiting the connection between said detector output to each of said first and second storage means during each sampling interval said detector output is coupled to the respective storage means so as to minimize the effects of ringing in said filter on the signal applied to said storage means.

29. Apparatus according to claim 24, wherein said first signal storage means comprises a first signal storage device for storing one of said demultiplexer output signals and said second signal storage means comprises a second signal storage device for storing the other of said demultiplexer output signals, further wherein one of said demultiplexer outputs is coupled to said first signal storage device and the other of said demultiplexer outputs is coupled to said second signal storage device.

30. Apparatus according to claim 24, wherein said apparatus determines the frequency response of said frequency dependent system throughout a predetermined spectrum divided into a plurality of discrete ones of said frequency bands by determining the frequency response in each of said frequency bands, wherein said apparatus further comprises a plurality of said assemblies, one for each of said frequency bands.

31. Apparatus according to claim 30, further including display means for displaying said frequency response throughout said spectrum.

32. Apparatus for determining the frequency response of a frequency dependent system comprising an input for receiving an input signal and an output for providing an output signal, said apparatus comprising:
   first apparatus input means for receiving said input signal;
   second apparatus input means for receiving said output signal;
   multiplexer means comprising first and second multiplexer inputs respectively coupled to said first and second apparatus input means and a multiplexer output, alternately coupling at a predetermined repetition rate in response to a first control signal for predetermined sampling intervals (a) said first multiplexer input to said multiplexer output so as to provide said input signal at said multiplexer output, and (b) said second multiplexer input to said multiplexer output so as to provide said output signal at said multiplexer output;
   signal level detector means, comprising a detector input coupled to said multiplexer output and a detector output, for alternately receiving said input signal and said output signal provided at said multiplexer output and for providing a detector output signal at said detector output when the signal at said multiplexer output includes signal energy falling within a preselected spectral band;
   switch means, responsive to a second control signal for (1) coupling said detector output with said switch output upon receipt of said third control signal so as to provide said detector output signal to said switch, and for (2) decoupling said detector output from said switch output upon receipt of said third control signal so that said detector output signal is not provided at said switch output;
   demultiplexer means, responsive to a second control signal synchronized with said first control signal and comprising a demultiplexer input and first and second demultiplexer outputs;
   switch means, coupled between the detector output and said demultiplexer input and responsive to a third control signal, for (1) inhibiting the connection between said detector output and said demultiplexer input at the beginning of each of said sampling intervals, and (2) connecting said detector output and said demultiplexer input during the remaining portion of each of said sampling intervals.
   first signal averaging means coupled to said first demultiplexer output for averaging said detector output signal when the latter is provided at said first demultiplexer output;
   second signal averaging means coupled to said second demultiplexer output for averaging said detector output signal when the latter is provided at said second demultiplexer output; and
   computer means, coupled to said multiplexer means, said frequency detector means, said switch means, and said demultiplexer means, for (1) generating said first, second and third control signals and (2) alternately sensing the stored signals stored in said first and second signal averaging means during successive sampling intervals and analyzing said stored signals in accordance with predetermined analytical functions so as to determine the frequency response of said frequency dependent system.

33. Apparatus for determining the frequency response, within each frequency band of a plurality of discrete, contiguous bands throughout a predetermined spectrum and in accordance with a predetermined analytical function, of a frequency dependent system defined by a system input for receiving an input signal and a system output for providing an output signal, said apparatus comprising:
   first apparatus input means for receiving said input signal;
   second apparatus input means for receiving said output signal; and
   a plurality of assembly means, one for and corresponding to each of said frequency bands, each of said assembly means comprising:
   (1) multiplexer means for providing a multiplexer output signal alternately corresponding to one of at least two multiplexer input signals in response to a first control signal and a predetermined repetition rate so as to provide alternating sampling intervals, said multiplexer means comprising (a) first and second multiplexer inputs, coupled to the corresponding first and second apparatus input means, for receiving said first and second multiplexer input signals respectively as a function of said input and output signals, and (b) a multiplexer output for providing said multiplexer output signal (i) substantially equal to said first multiplexer input signal when said first control signal is of a first state, and (ii) substantially equal to said second multiplexer input signal when said first control signal is of a second state;

(2) detector means, including a detector input coupled to said multiplexer output and a detector output, for providing a detector output signal at said detector output as a function of the signal energy in said multiplexer output signal within the respective frequency band corresponding to said assembly;

(3) demultiplexer means for alternatively providing one of at least two demultiplexer output signals substantially equal to a demultiplexer input signal in response to a second control signal and at said predetermined repetition rate synchronized with said multiplexer means, said demultiplexer means comprising (a) a demultiplexer input coupled to the detector output for receiving said demultiplexer input signal as a function of said detector output signal and (b) at least two demultiplexer outputs for selectively and respectively providing one of said demultiplexer output signals when said second control signal is of a first state and the other of said demultiplexer output signals when said second control signal is of a second state, wherein said demultiplexer output signals are respectively a function of the signal energy within the respective frequency band of said first and second multiplexer input signals depending on the state of said first control signal; and (4) first and second signal storage means, respectively coupled to said demultiplexer outputs, for respectively storing said demultiplexer output signals; and computer means, coupled to said multiplexer means, demultiplexer means and each of said signal storage means, for (a) generating said first and second control signals so that said first and second demultiplexer output signals stored in said signal storage means of each of said assembly means are a function and representation of the signal energy in the corresponding spectral band of said input and output signals, respectively and (b) analyzing said first and second demultiplexer output signals in said signal storage means of each of said assembly means in accordance with said predetermined analytical function so as to determine said frequency response.

34. Apparatus according to claim 33, wherein said predetermined rate is the same for all of said assembly means.

35. Apparatus according to claim 33, wherein said predetermined rate of each of said assembly means is a function of the frequency band corresponding to each assembly means.

36. Apparatus according to claim 35, wherein the predetermined rate of each of said assembly means decreases with increasing frequencies of the frequency band corresponding to each assembly means.

* * * * *

UNITED STATES PATENT AND TRADEMARK OFFICE
CERTIFICATE OF CORRECTION

PATENT NO. : 4,782,284
DATED : November 1, 1988
INVENTOR(S) : Robert W. Adams & Donald M. Boettger It is certified that error appears in the above-identified patent and that said Letters Patent is hereby corrected as shown below:

Claim 26, column 17, line 1, delete "multiplexor" and substitute therefor -- multiplexer --.

Claim 32, column 18, line 17, delete "." and substitute therefor -- ; --.

Signed and Sealed this

Fourth Day of April, 1989

Attest:

DONALD J. QUIGG

Attesting Officer

Commissioner of Patents and Trademarks